US010670669B2

(12) United States Patent
Lassalle-Balier et al.

(10) Patent No.: US 10,670,669 B2
(45) Date of Patent: *Jun. 2, 2020

(54) MAGNETIC FIELD SENSOR FOR MEASURING AN AMPLITUDE AND A DIRECTION OF A MAGNETIC FIELD USING ONE OR MORE MAGNETORESISTANCE ELEMENTS HAVING REFERENCE LAYERS WITH THE SAME MAGNETIC DIRECTION

(71) Applicant: Allegro MicroSystems, LLC, Manchester, NH (US)

(72) Inventors: Rémy Lassalle-Balier, Bures sur Yvette (FR); Bryan Cadugan, Bedford, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 66 days.

This patent is subject to a terminal disclaimer.

(21) Appl. No.: 16/157,313

(22) Filed: Oct. 11, 2018

(65) Prior Publication Data

US 2020/0116799 A1    Apr. 16, 2020

(51) Int. Cl.
*G01R 33/00* (2006.01)
*G01R 33/09* (2006.01)
*G01D 5/16* (2006.01)

(52) U.S. Cl.
CPC ......... *G01R 33/0041* (2013.01); *G01D 5/16* (2013.01); *G01R 33/09* (2013.01)

(58) Field of Classification Search
CPC ....... G01R 33/0041; G01R 33/09; G01D 5/16
(Continued)

(56) References Cited

U.S. PATENT DOCUMENTS 5,216,560 A    6/1993  Brug et al.
5,561,368 A   10/1996  Dovek et al.
(Continued)

FOREIGN PATENT DOCUMENTS

EP    2589975 A2    5/2013
EP    2752676 A1    7/2014

OTHER PUBLICATIONS

Office Action dated Feb. 3, 2020 for U.S. Appl. No. 16/157,317; 11 pages.
(Continued)

*Primary Examiner* — Melissa J Koval
*Assistant Examiner* — Rahul Maini
(74) *Attorney, Agent, or Firm* — Daly, Crowley, Mofford & Durkee, LLP

(57) ABSTRACT

A magnetic field sensor can include a substrate disposed in an x-y plane with x and y axes; one or more magnetoresistance elements, wherein magnetic directions of reference layers of each of the one or more magnetoresistance elements are parallel to the x axis; wherein the one or more magnetoresistance elements are operable to generate a magnetoresistance element signal; a first current conductor operable to generate a first AC magnetic field in an x-direction and a second current conductor operable to generate a second AC magnetic field in a y-direction; and a component determination circuit comprising at least two of: a first demodulator to demodulate the magnetoresistance element signal with a first clock signal with a first frequency, a second demodulator coupled to demodulate the magnetoresistance element signal with the first clock signal or with a second clock signal with a second frequency, or a low pass filter operable to filter the magnetoresistance element signal.

32 Claims, 11 Drawing Sheets

(58) Field of Classification Search
USPC .................................................. 324/207.21
See application file for complete search history.

(56) References Cited

U.S. PATENT DOCUMENTS

| | | | |
|---|---|---|---|
| 6,166,539 | A | 12/2000 | Dahlberg et al. |
| 6,501,678 | B1 | 12/2002 | Lenssen et al. |
| 7,064,937 | B2 | 6/2006 | Wan et al. |
| 7,259,545 | B2 | 8/2007 | Stauth et al. |
| 7,838,133 | B2 | 11/2010 | Zhang et al. |
| 8,269,491 | B2 | 9/2012 | Cummings et al. |
| 9,046,562 | B2 | 6/2015 | Cummings et al. |
| 9,465,056 | B2 | 10/2016 | Han et al. |
| 10,060,880 | B2 | 8/2018 | Chen et al. |
| 2008/0258721 | A1 | 10/2008 | Guo et al. |
| 2009/0237075 | A1 | 9/2009 | Koss |
| 2010/0007344 | A1 | 1/2010 | Guo et al. |
| 2010/0277971 | A1 | 11/2010 | Slaughter et al. |
| 2014/0253106 | A1 | 9/2014 | Granig et al. |
| 2015/0022196 | A1 | 1/2015 | Hebiguchi et al. |
| 2015/0177286 | A1 | 6/2015 | Fuji et al. |
| 2015/0333254 | A1 | 11/2015 | Liu et al. |
| 2016/0359103 | A1 | 12/2016 | Fermon et al. |
| 2017/0314969 | A1 | 11/2017 | Ausserlechner et al. |
| 2018/0087889 | A1 | 3/2018 | Ausserlechner et al. |

OTHER PUBLICATIONS

U.S. Appl. No. 16/157,317, filed Oct. 11, 2018, Lassalle-Balier et al.
U.S. Appl. No. 15/869,620, filed Jan. 12, 2018, Cadugan et al.
U.S. Appl. No. 15/895,418, filed Feb. 13, 2018, Cadugan et al.
Allegro MicroSystems, LLC Datasheet dated Dec. 1, 2017, ACS70331 High Sensitivity, 1 MHz, GMR-Based Current Sensor IC in Space-Saving Low Resistance QFN package; 22 pages.
Notice of Allowance dated Aug. 22, 2019 for U.S. Appl. No. 15/869,620; 11 pages.
Notice of Allowance dated Aug. 8, 2019 for U.S. Appl. No. 15/895,418; 10 pages.
Amendment and Request for Continued Examination (RCE) dated Sep. 30, 2019 for U.S. Appl. No. 15/895,418; 27 pages.
Notice of Allowance dated Dec. 23, 2019 for U.S. Appl. No. 15/895,418; 13 pages.
Extended Search Report dated Mar. 3, 2020 for European Application No. 19202154.1; 7 pages.

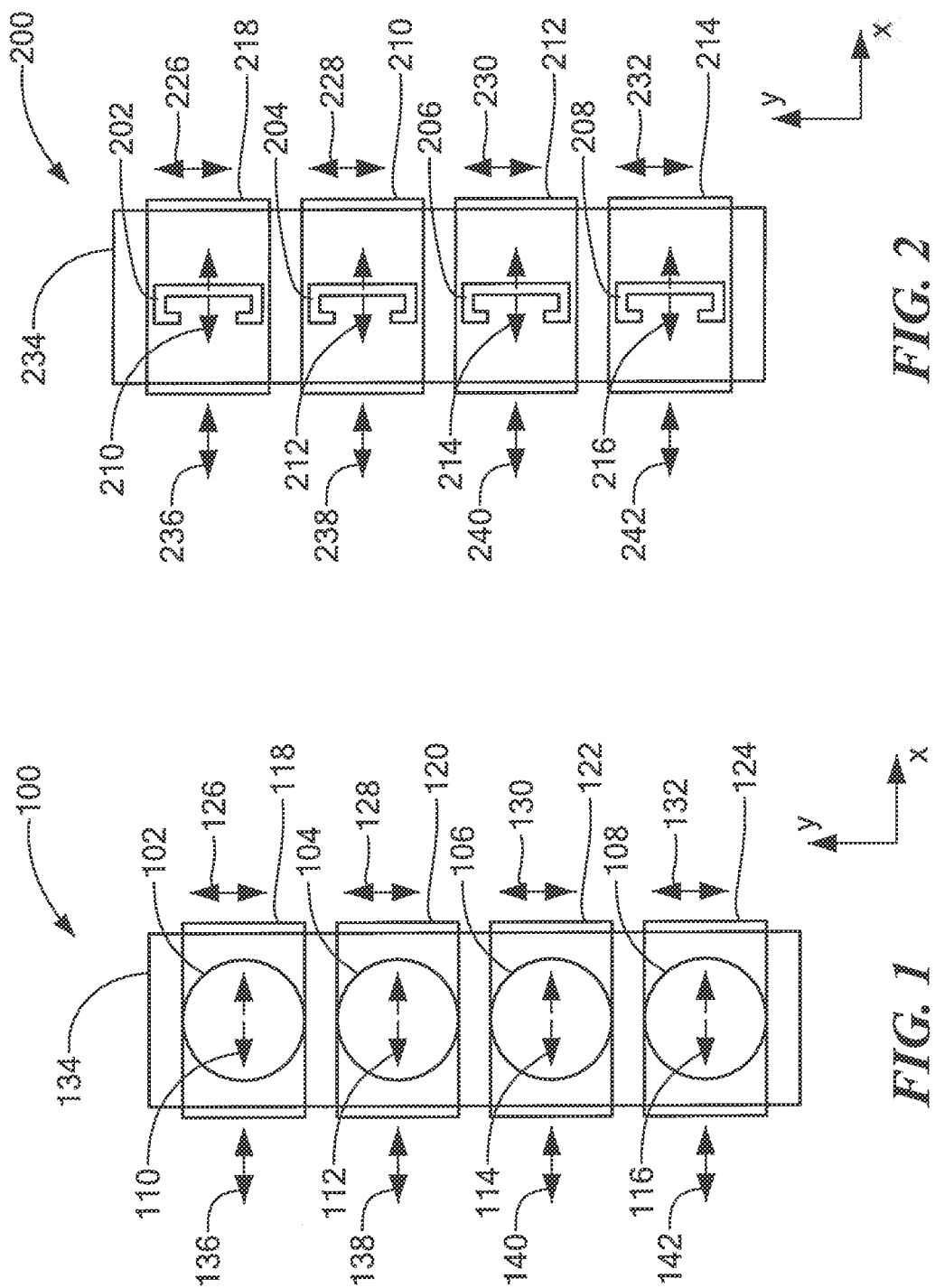

US 10,670,669 B2

MAGNETIC FIELD SENSOR FOR MEASURING AN AMPLITUDE AND A DIRECTION OF A MAGNETIC FIELD USING ONE OR MORE MAGNETORESISTANCE ELEMENTS HAVING REFERENCE LAYERS WITH THE SAME MAGNETIC DIRECTION

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to a magnetic field sensor for measuring an amplitude and a direction of a magnetic field using one or more magnetoresistance elements, each of which have a respective reference layer with the same magnetic direction.

BACKGROUND

As used herein, the term "magnetic field sensing element" is used to describe a variety of electronic elements that can sense a magnetic field. One such magnetic field sensing element is a magnetoresistance (MR) element. The magnetoresistance element has a resistance that changes in relation to a magnetic field experienced by the magnetoresistance element.

As is known, there are different types of magnetoresistance elements, for example, a giant magnetoresistance (GMR) element and a tunneling magnetoresistance (TMR) element, also called a magnetic tunnel junction (MTJ) element.

Of these magnetoresistance elements, the GMR and the TMR elements operate with spin electronics (i.e., electron spins) where the resistance is related to the magnetic orientation of different magnetic layers separated by nonmagnetic layers. In spin valve configurations, the resistance is related to an angular direction of a magnetization in a so-called "free-layer" relative to another layer so-called "reference layer." The free layer and the reference layer are described more fully below.

Most, but not all, magnetoresistance elements have a maximum response axis parallel to a substrate upon which they are formed.

The magnetoresistances element may be used as a single element or, alternatively, may be used as two or more magnetoresistance elements arranged in various configurations, e.g., a half bridge or full (Wheatstone) bridge.

As used herein, the term "magnetic field sensor" is used to describe a circuit that uses one or more magnetic field sensing elements, generally in combination with other circuits. In a typical magnetic field sensor, the magnetic field sensing element and the other circuits can be integrated upon a common substrate, for example, a semiconductor substrate. In some embodiments, the magnetic field sensor can also include a lead frame and packaging.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Various parameters characterize the performance of magnetic field sensors and magnetic field sensing elements. With regard to magnetic field sensing elements, the parameters include sensitivity, which is the change in the output signal of a magnetic field sensing element in response to a magnetic field, and linearity, which is the degree to which the output signal of a magnetic field sensor varies linearly (i.e., in direct proportion) to the magnetic field. The parameters also include offset, which describes and output from the magnetic field sensing element that is not indicative of zero magnetic field when the magnetic field sensor experiences a zero magnetic field.

GMR and TMR elements are known to have a relatively high sensitivity, compared, for example, to Hall effect elements. Thus, a current sensor that uses GMR or TMR elements can sense smaller currents than can a current sensor that uses Hall effect elements.

TMR elements are known to have a higher sensitivity than GMR elements, but at the expense of higher noise at low frequencies.

One type of magnetic field sensor can measure a magnetic field and generate an output signal responsive to an amplitude and/or and direction of an external magnetic field generated outside of the magnetic field sensor. In order to perform this function, some magnetic field sensors use magnetoresistance elements arranged with magnetic directions of reference layers and maximum response axes in orthogonal x-y directions. However, it can be difficult to fabricate, on a single semiconductor substrate, magnetoresistance elements with orthogonal reference layers and maximum response directions due to the different annealing steps and magnetic directions that must be used to fabricate the magnetoresistance elements.

Thus, it would be desirable to provide a magnetic field sensor that can generate an output signal responsive to an amplitude and/or and direction of an external magnetic field generated outside of the magnetic field sensor, wherein the one or more magnetoresistance elements each have a respective reference layer with the same magnetic direction.

SUMMARY

The present invention provides a magnetic field sensor that can generate an output signal responsive to an amplitude and/or and direction of an external magnetic field generated outside of the magnetic field sensor, wherein the one or more magnetoresistance elements each have the same direction of maximum response.

In accordance with an example useful for understanding an aspect of the present invention, a magnetic field sensor can include:

a substrate having a major surface in an x-y plane having an x axis and a y axis;

one or more magnetoresistance elements disposed on the substrate, wherein magnetic directions of reference layers of each of the one or more magnetoresistance elements are parallel to the x axis; wherein the one or more magnetoresistance elements are operable to generate a magnetoresistance element signal responsive to an external magnetic field;

a first current conductor disposed on the substrate and operable to generate a first AC magnetic field in an x-direction parallel to the x axis, the first AC magnetic field proximate to the one or more magnetoresistance elements, the first AC magnetic field having a first frequency;

a second current conductor operable to generate a second AC magnetic field in a y-direction parallel to the y axis, the second magnetic field proximate to the one or more magnetoresistance elements, the second AC magnetic field having the first frequency or a second frequency different than the first frequency; and a component determination circuit disposed on the substrate and coupled to receive the magnetoresistance element signal, wherein the component determination circuit comprises at least two of:

a first demodulator coupled to the magnetoresistance element signal and coupled to receive a first clock signal with the first frequency, the first demodulator operable to demodulate the magnetoresistance element signal with the first clock signal to generate a first demodulated signal, a second demodulator coupled to the magnetoresistance element signal and coupled to receive the first clock signal with the first frequency or a second clock signal with the second frequency, the second demodulator operable to demodulate the magnetoresistance element signal with the first clock signal or with the second clock signal to generate a second demodulated signal, or a low pass filter operable to filter the magnetoresistance element signal to generate a filtered signal.

In accordance with another example useful for understanding another aspect of the present invention, a method used in a magnetic field sensor responsive to an external magnetic field generated outside of the magnetic field sensor, can include:

generating a magnetoresistance element signal responsive to the external magnetic field with one or more magnetoresistance elements disposed on a substrate, the substrate having a major surface in an x-y plane having an x axis and a y axis wherein magnetic directions of reference layers of each of the one or more magnetoresistance elements are parallel to the x-axis;

generating a first AC magnetic field in an x-direction parallel to the x axis with a first current conductor disposed on the substrate, the first AC magnetic field proximate to the one or more magnetoresistance elements, the first AC magnetic field having a first frequency;

generating a second AC magnetic field in a y-direction parallel to the y axis with a second current conductor, the second magnetic field proximate to the one or more magnetoresistance elements, the second AC magnetic field having the first frequency or a second frequency different than the first frequency; and at least two of:

demodulating, with a first demodulator, the magnetoresistance element signal with the first clock signal to generate a first demodulated signal, demodulating, with a second demodulator, the magnetoresistance element signal with the first clock signal or with the second clock signal to generate a second demodulated signal, or filtering the magnetoresistance element signal with a low pass filter to generate a filtered signal.

In accordance with another example useful for understanding another aspect of the present invention, a magnetic field sensor responsive to an external magnetic field generated outside of the magnetic field sensor can include:

means for generating a magnetoresistance element signal responsive to the external magnetic field with one or more magnetoresistance elements disposed on a substrate, the substrate having a major surface in an x-y plane having an x axis and a y axis, wherein magnetic directions of reference layers of each of the one or more magnetoresistance elements are parallel to the x-axis;

means for generating a first AC magnetic field in an x-direction parallel to the x axis with a first current conductor disposed on the substrate, the first AC magnetic field proximate to the one or more magnetoresistance elements, the first AC magnetic field having a first frequency;

means for generating a second AC magnetic field in a y-direction parallel to the y axis with a second current conductor, the second magnetic field proximate to the one or more magnetoresistance elements, the second AC magnetic field having the first frequency or a second frequency different than the first frequency; and at least two of:

means for demodulating, with a first demodulator, the magnetoresistance element signal with the first clock signal to generate a first demodulated signal, means for demodulating, with a second demodulator, the magnetoresistance element signal with the first clock signal or with the second clock signal to generate a second demodulated signal, or means for filtering the magnetoresistance element signal with a low pass filter to generate a filtered signal.

BRIEF DESCRIPTION OF THE DRAWINGS

The foregoing features of the invention, as well as the invention itself may be more fully understood from the following detailed description of the drawings, in which:

FIG. 1 is a block diagram showing a TMR (tunneling magnetoresistance) element having a plurality of TMR pillars, showing four current conductors that can be used to generate four AC magnetic fields proximate to the four pillars and parallel to a y axis and one current conductor that can be used to generate four magnetic fields parallel to an x axis and proximate to the four pillars;

FIG. 2 is a block diagram showing a plurality of GMR (giant magnetoresistance) elements, showing four current conductors that can be used to generate four AC magnetic fields proximate to the four GMR elements and parallel to a y axis and one current conductor that can be used to generate four magnetic fields parallel to an x axis and proximate to the four GMR elements;

Figure 5:
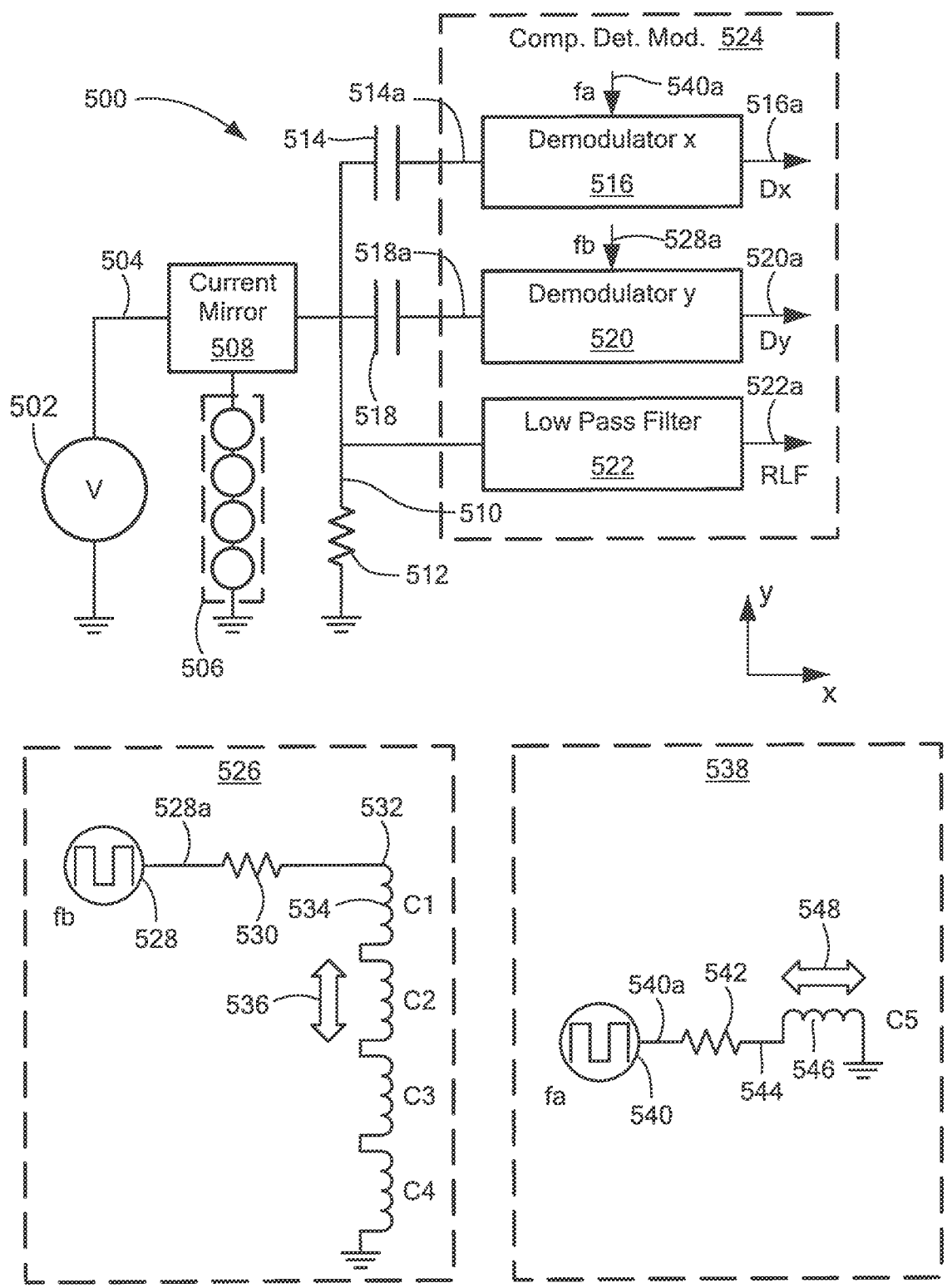
FIG. 5 is a block diagram showing a portion of an illustrative magnetic field sensor that can use one or more of the illustrative TMR pillars of FIG. 4 and that can generate a first demodulated signal, a second demodulated signal, and a filtered signal.
Figure 6:
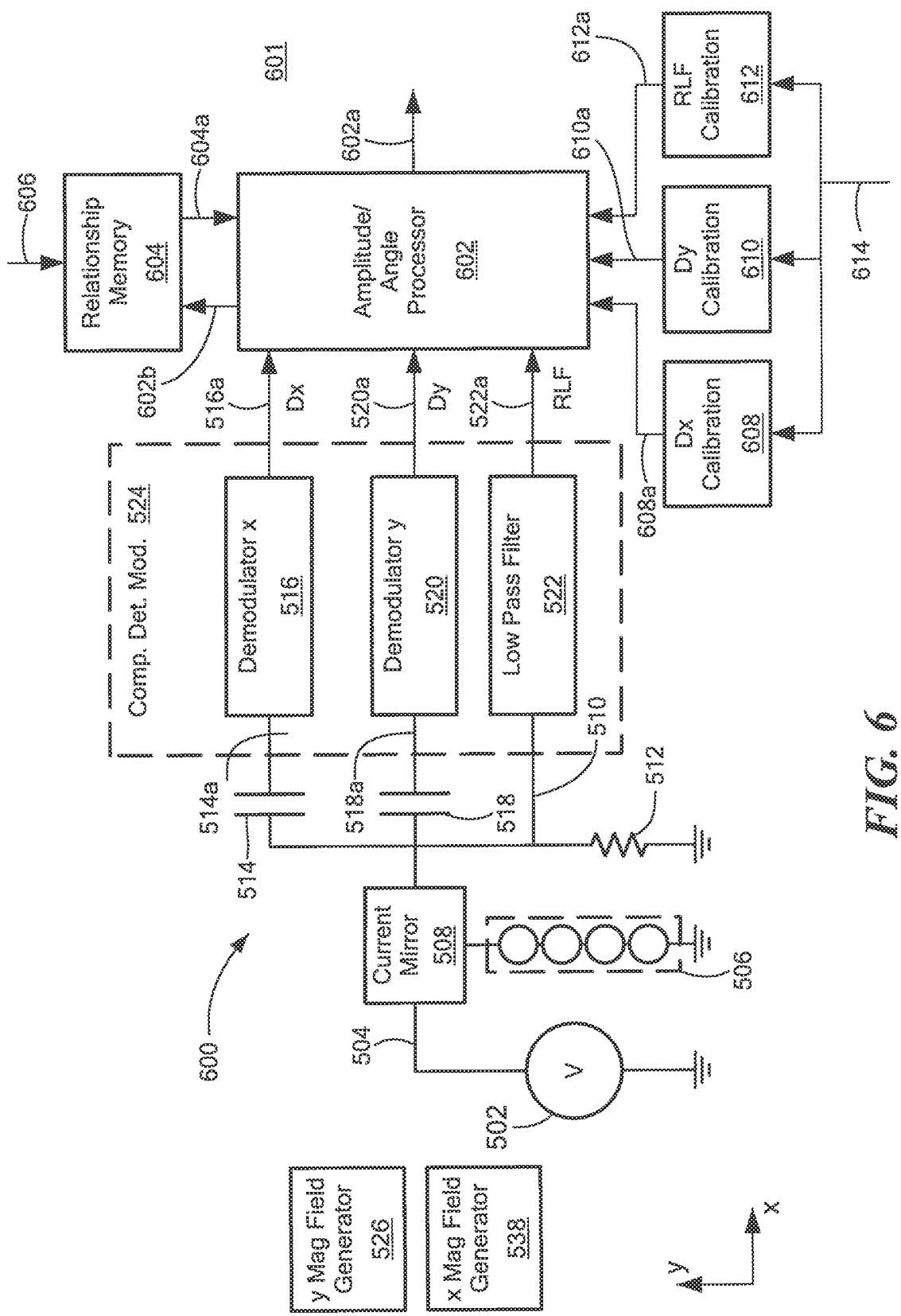
FIG. 6 is a block diagram showing an illustrative magnetic field sensor that can use the portion of the magnetic field sensor of FIG. 5.
Figure 7:
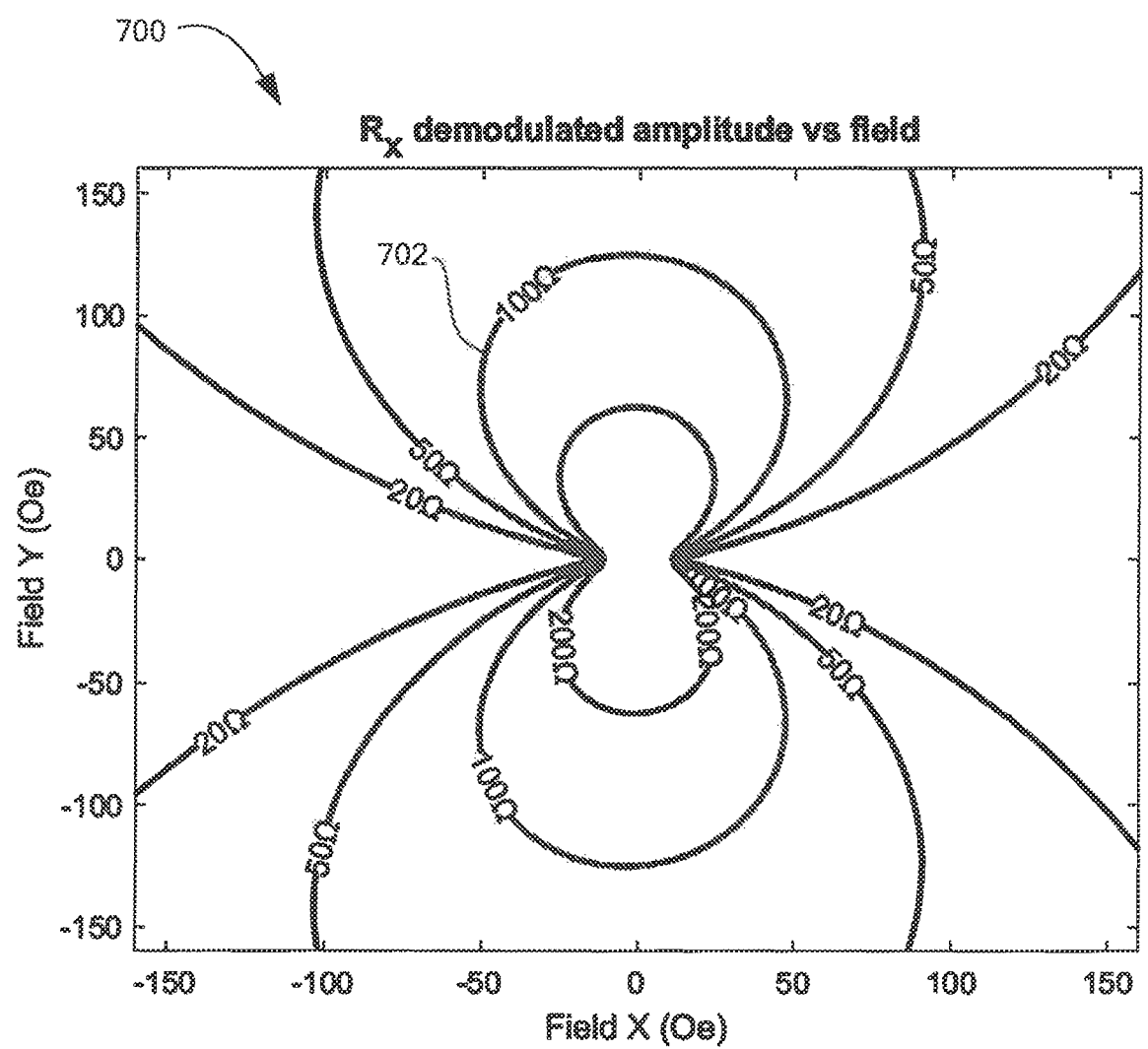
FIG. 7 is a graph that shows a first illustrative relationship between values of the first demodulated signal of FIGS. 5 and 6 and values of projected x and y components of an external magnetic field projected onto x and y axes of an x-y plane.
Figure 8:
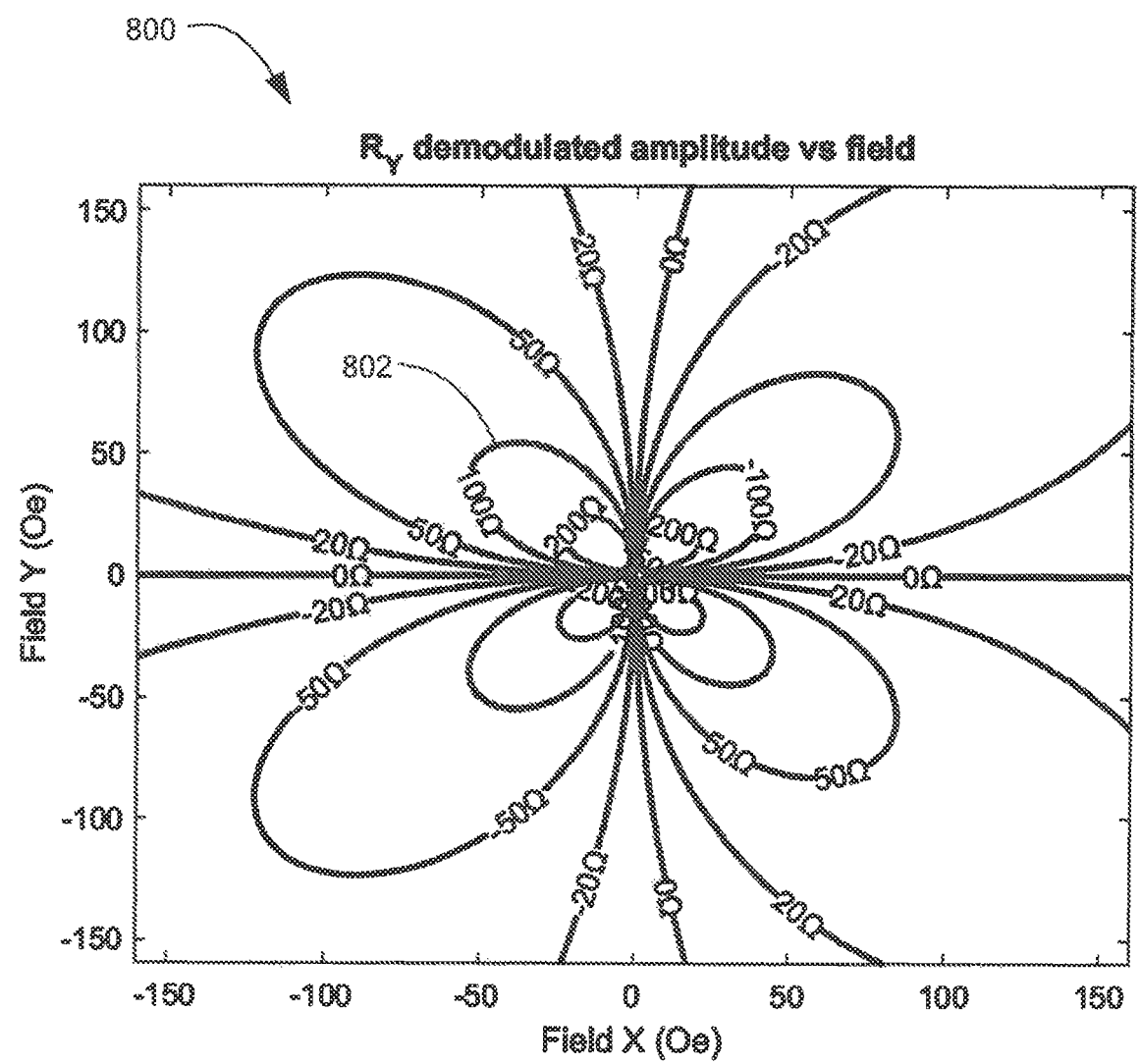
Figure 9:
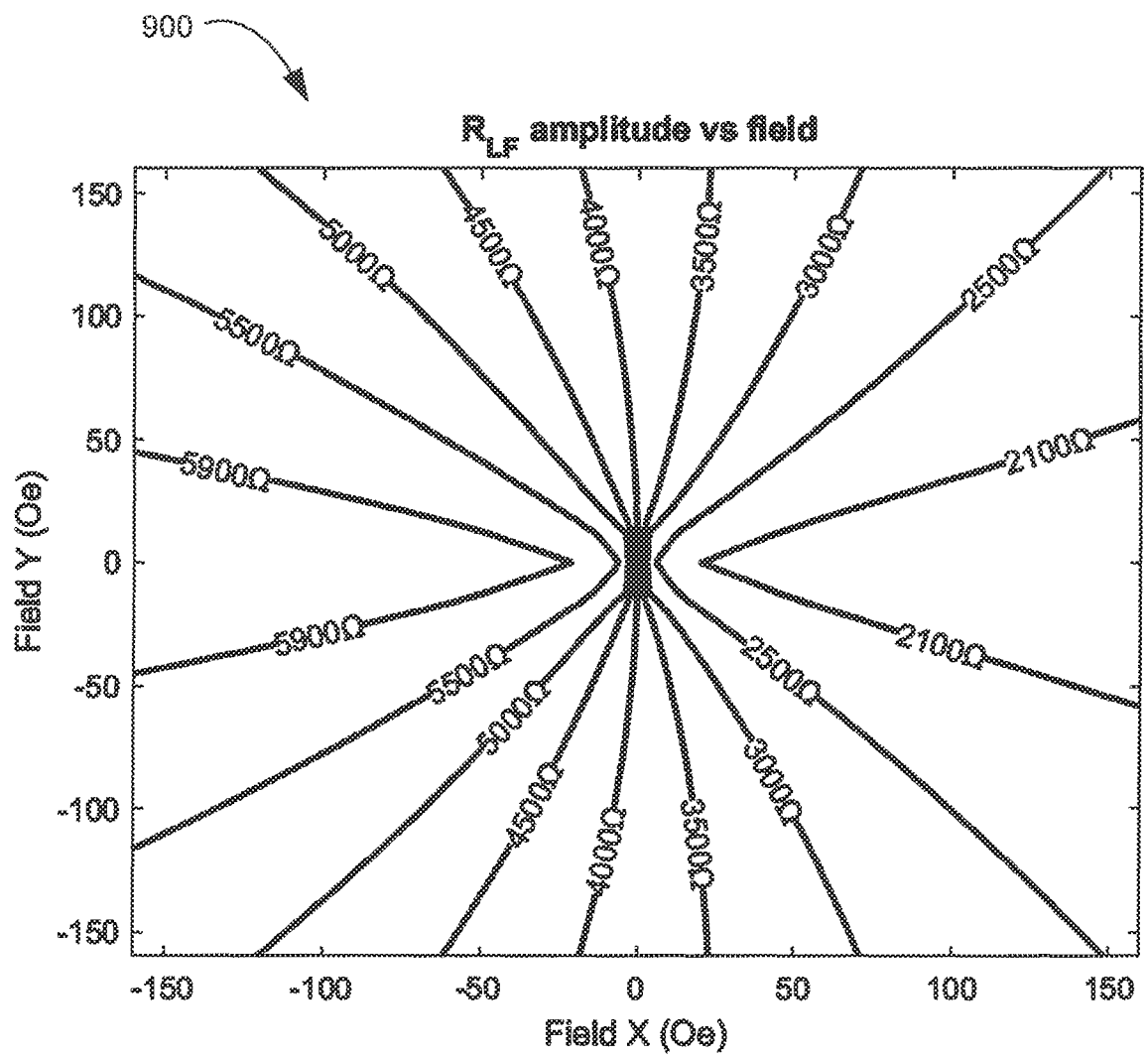
Figure 10:
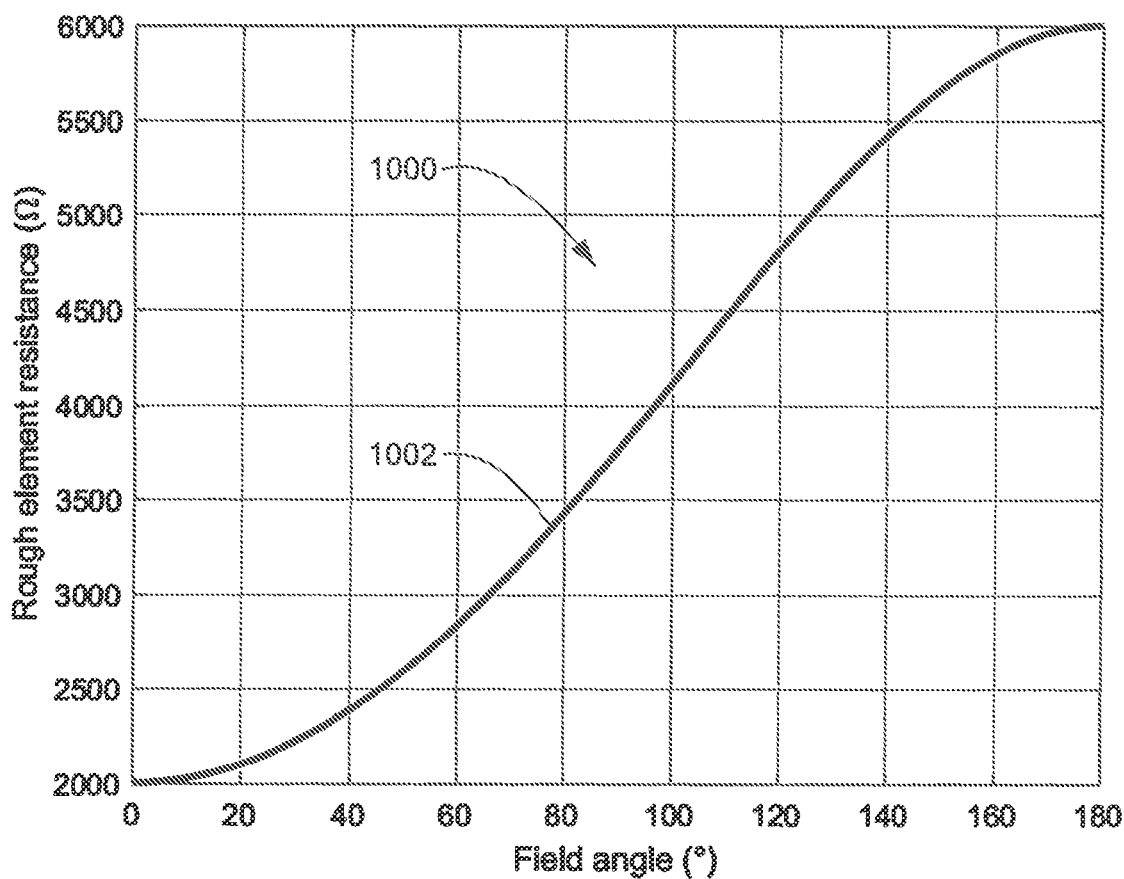
Figure 11:
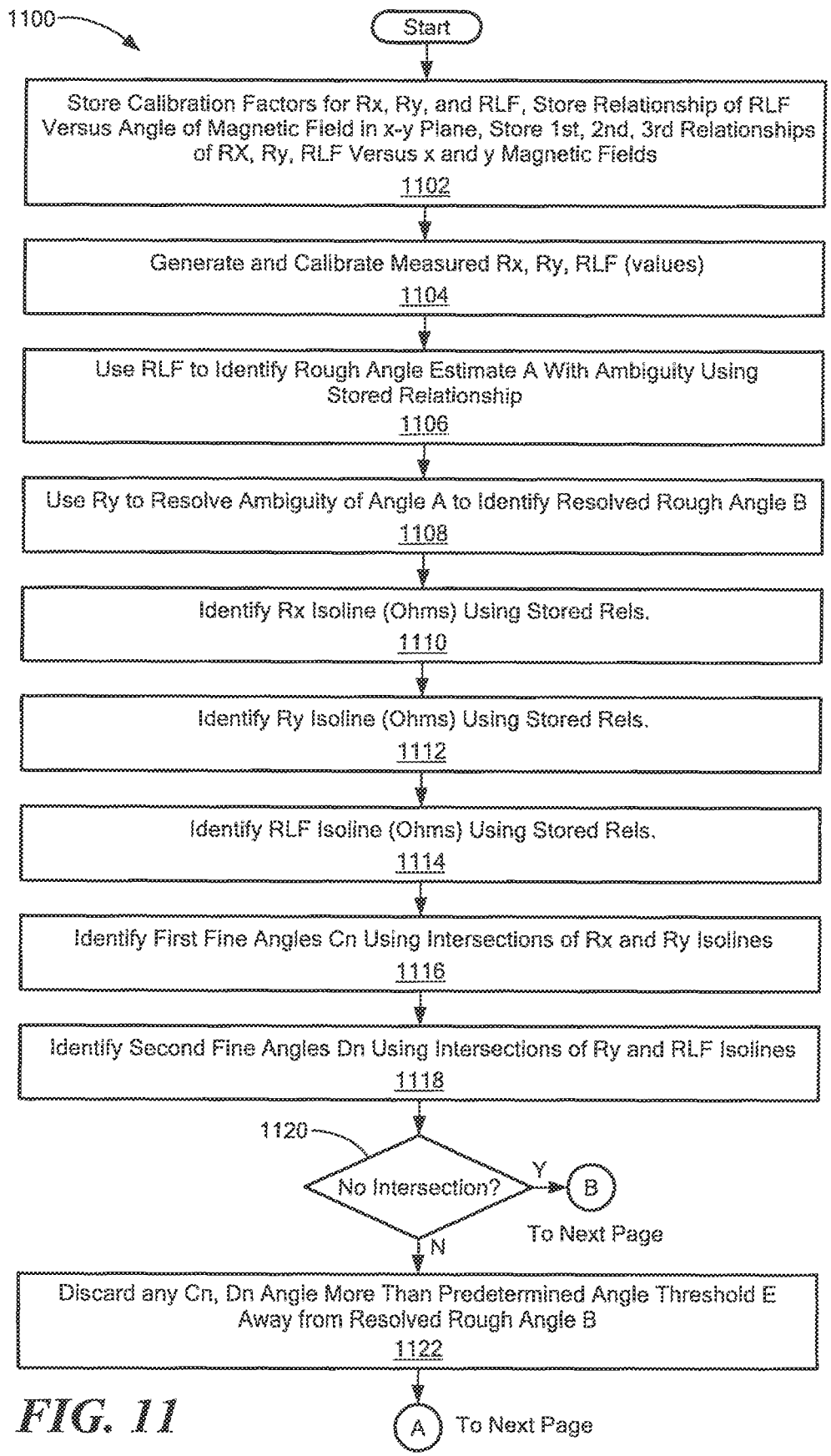
Figure 12:
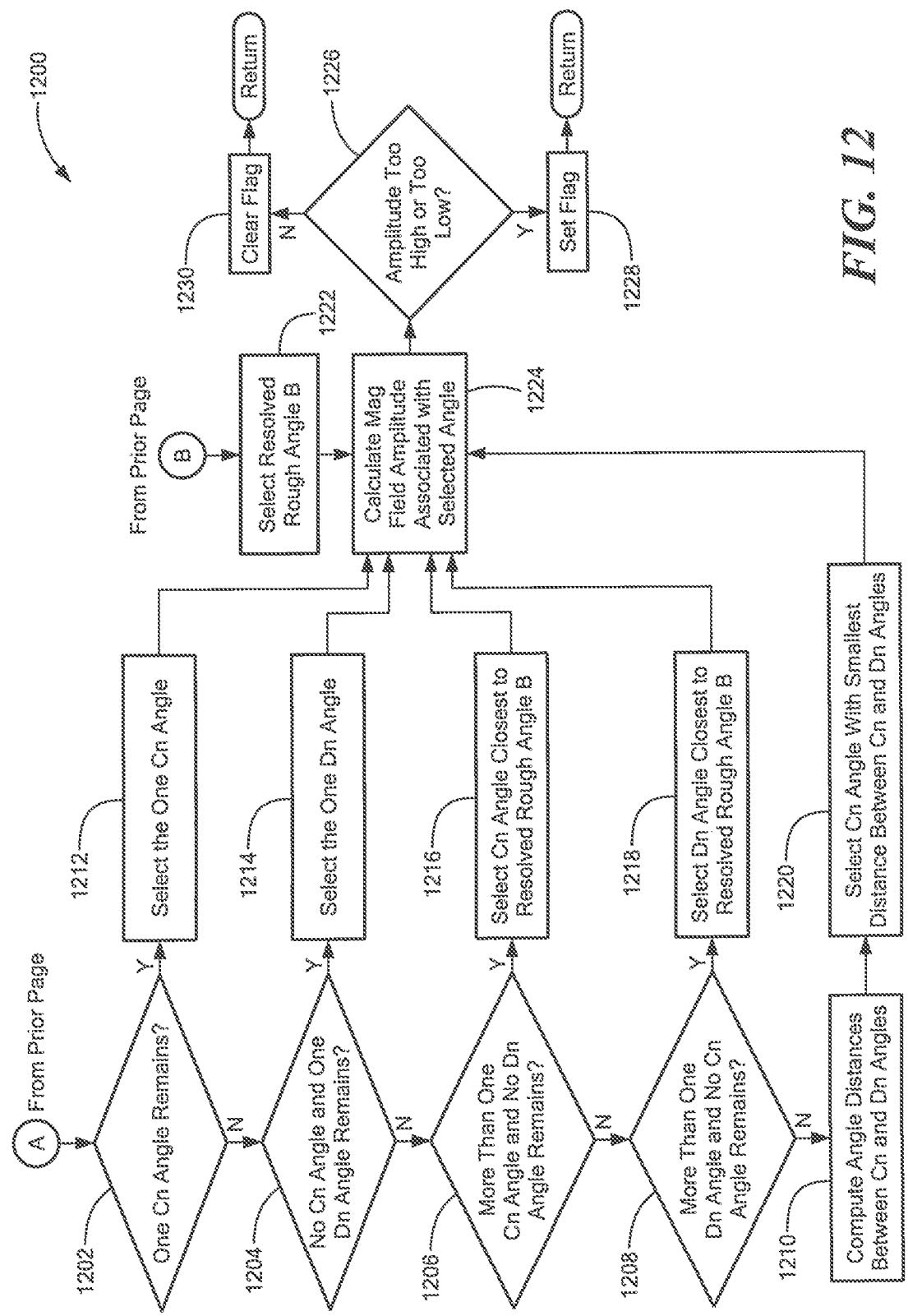

FIG. 8 is a graph that shows a second illustrative relationship between values of the second demodulated signal of FIGS. 5 and 6 and values of projected x and y components of an external magnetic field projected onto x and y axes of an x-y plane;

FIG. 9 is a graph that shows a third illustrative relationship between values of the filtered signal of FIGS. 5 and 6 and values of projected x and y components of an external magnetic field projected onto x and y axes of an x-y plane;

FIG. 10 is a graph showing a fourth illustrative relationship between a resistance of four of the illustrative TMR pillars of FIG. 5 versus a rough angle estimate of an angle of an external magnetic field projected onto an x-y plane; and FIGS. 11 and 12 are block diagrams that together show an illustrative process that can use selected ones of the first demodulated signal, the second demodulated signal, the filtered signal, the first relationship of FIG. 7, the second relationship of FIG. 8, the third relationship of FIG. 9, and the relationship to FIG. 10 to generate an estimate of an amplitude and/or an angle of an external magnetic field projected onto an x-y plane.

DETAILED DESCRIPTION

Before describing the present invention, it should be noted that reference is sometimes made herein to GMR or TMR elements having particular shapes (e.g., yoke shaped or pillar shaped). One of ordinary skill in the art will appreciate, however, that the techniques described herein are applicable to a variety of sizes and shapes.

As used herein, the term "anisotropy" or "anisotropic" refer to a material that has different properties according to direction in the material. A magnetoresistance element can have a particular axis or direction to which the magnetization of a ferromagnetic or ferrimagnetic layer tends to orientate when it does not experience an additional, external, magnetic field. An axial anisotropy can be created by a crystalline effect or by a shape anisotropy, both of which can allow two equivalent directions of magnetic fields. A directional anisotropy can also be created in an adjacent layer, for example, by an antiferromagnetic layer, which allows only a single magnetic field direction along a specific axis in the adjacent layer.

In view of the above, it will be understood that introduction of an anisotropy in a magnetic layer results in forcing the magnetization of the magnetic layer to be parallel to that anisotropy in the absence of an external field. In the case of a GMR or TMR element, a directional anisotropy provides an ability to obtain a coherent rotation of the magnetization in a magnetic layer in response, for example, to an external magnetic field, which has the property of suppressing the hysteresis behavior of the corresponding element.

As described above, as used herein, the term "magnetic field sensing element" is used to describe a variety of different types of electronic elements that can sense a magnetic field. A magnetoresistance element is but one type of magnetic field sensing element.

As is known, there are different types of magnetoresistance elements, for example, a semiconductor magnetoresistance element such as a giant magnetoresistance (GMR) element and a tunneling magnetoresistance (TMR) element, also called a magnetic tunnel junction (MTJ) element. Metal based or metallic magnetoresistance elements (e.g., GMR, TMR, AMR) and tend to have axes of maximum sensitivity parallel to a substrate. However, some TMR elements can have an axis of maximum sensitivity perpendicular to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

The terms "parallel" and "perpendicular" may be used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the terms "substantially" and the term "about" reflect angles that are within manufacturing tolerances, for example, within +/− ten degrees.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe an electronic component that has at least one p-n junction. A transistor, a diode, and a logic gate are examples of active electronic components. In contrast, as used herein, the term "passive electronic component" as used to describe an electronic component that does not have at least one p-n junction. A capacitor and a resistor are examples of passive electronic components.

As used herein, the term "amplifier" is used to describe a circuit element with a gain greater than one, less than one, or equal to one.

As used herein, the terms "line" and "linear" are used to describe either a straight line or a curved line. The line can be described by a function having any order less than infinite.

Structures and methods described herein apply to both GMR and TMR magnetoresistance elements, but, only TMR elements are used in some examples herein.

However, it should be appreciated that the same or similar structures and methods can apply to other spin electronics magnetoresistance elements, either now known or later discovered. This includes, in particular, oxide-based spin electronics structures.

Referring to FIG. 1, an illustrative TMR element 100 can have a plurality of TMR pillars, e.g., four TMR pillars 102, 104, 106, 108. The TMR pillars 102, 104, 106, 108 can have maximum response axes in an x direction parallel to an x axis as indicated by arrows 110, 112, 114, 116. Reference layers of the TMR elements 102, 104, 106, 108 can have magnetic directions parallel to the x axis.

A plurality of coils, e.g., four coils 118, 120, 122, 124 or other magnetic field generating structures such as a current conductors, can be operable to generate a plurality of AC magnetic fields, e.g., four magnetic fields, parallel to a y axis, the magnetic fields indicated by arrows 126, 128, 130, 132, passing through the plurality of TMR pillars. A coil 134 or other magnetic field generating structure such as a current conductor, can be operable to generate a plurality of AC magnetic fields, e.g., four magnetic fields, parallel to an x axis, the magnetic fields indicated by arrows 136, 138, 140, 142, passing through the plurality of TMR pillars.

Referring now to FIG. 2, an illustrative GMR structure 200 can have a plurality of GMR elements, e.g., four GMR elements 202, 204, 206, 208. The GMR elements 202, 204, 206, 208 can have maximum response axes in an x direction parallel to an axis as indicated by arrows 210, 212, 214, 216. Reference layers of the GMR elements 202, 204, 206, 208 can have magnetic directions parallel to the x axis, in a direction perpendicular to a long dimension of the GMR elements 202, 204, 206, 208.

A plurality of coils, e.g., four coils 218, 220, 222, 224, or other magnetic field generating structures such as a current conductors, can be operable to generate a plurality of magnetic fields, e.g., four magnetic fields, parallel to a y axis, the magnetic fields indicated by arrows 226, 228, 230, 232, passing through the plurality of GMR elements. A coil 234 or other magnetic field generating structure such as a current conductor, can be operable to generate a plurality of magnetic fields, e.g., four magnetic fields, parallel to the x axis, the magnetic fields indicated by arrows 236, 238, 240, 242, passing through the plurality of GMR pillars.

Figure 3:
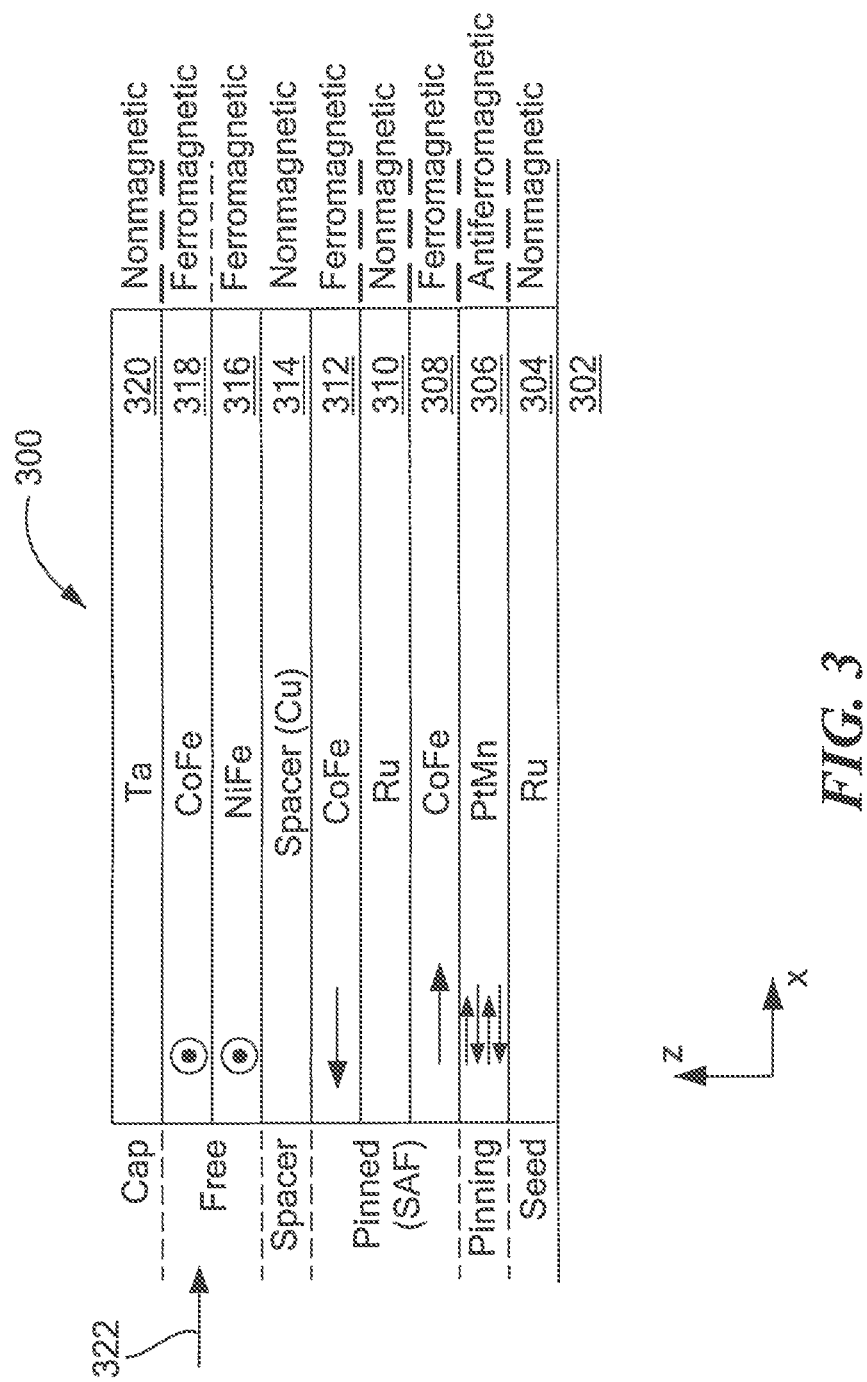
FIG. 3 is a block diagram showing a cross section of an illustrative single pinned GMR element.

Referring now to FIG. 3, an illustrative single pinned GMR element 300 can be comprised of a stack of layers 304-320 disposed upon a surface of a substrate 302.

It will be understood that driving current can run across the layers of a GMR stack of layers, i.e., parallel to the surface of the substrate 302. However, in some embodiments, the driving current can run through the layers in a direction perpendicular to the substrate 302. The GMR element 300 can have a maximum response axis that is parallel to the surface of the substrate and that is in a direction 322 perpendicular to zero field magnetic directions of the free layers 316, 318, and also parallel to the field generated by the reference layers, most notably the pinning layer 306.

The GMR element 300 is single pinned, i.e., it has one pinning layers 306. A synthetic antiferromagnet (SAF) pinned layer structure 308, 310, 312 is magnetically coupled to the pinning layer 306. The layers 306, 308, 310, 312 are collectively referring to as reference layers. At zero external magnetic field, the free layers 316, 318 take on a magnetic alignment perpendicular to the reference layers 306, 308, 310, 312.

While single pinned elements are described in examples herein, in other embodiments, double pinned arrangements are also possible with two pinning layers and two pinned layers on opposite sides of the free layers.

As described above, in general, the GMR element 300 has a maximum response axis (maximum response to external fields) aligned with arrow 322, i.e., parallel with a reference direction of the reference layers 306, 308, 310, 312. Also, in general, it is rotations of the magnetic direction of the free layers 312, 314 caused by external magnetic fields that result in changes of resistance of the GMR stack 300.

The cross alignment of the free layers out of the page can be facilitated by a shape anistropy of the GMR element 300. For example, if a top view of the GMR element 300 has a yoke with a width less than a length, the free layers, in the absence of an external magnetic field, will tend to align with the length dimension. The reference layers can be annealed to be perpendicular to the length direction. The maximum response axis 322 can be parallel to the magnetic direction of the reference layers 306, 308, 310, 312. In the absence of a magnetic field, the magnetic direction of the free layers 316, 318 can be substantially perpendicular to the magnetic direction of the reference layers. An external magnetic field, depending upon angle of the external magnetic field, tends to make the magnetic direction of the free layers change or rotate to align with the external magnetic field, resulting in changes of the resistance of the GMR element 300.

The GMR element 300 can directly sense magnetic fields that have a projected x component in the direction of the arrow 322, i.e., in an x direction parallel to a x axis of Cartesian coordinates x-y. Accordingly, external magnetic fields generated outside of a magnetic field sensor proximate to the GMR element 300 and parallel to the x axis tend to be directly measured by the GMR element 300, essentially by measuring offset shifts (i.e., resistance shifts) of AC signals generated by the magnetic fields 236, 238, 240, 242 of FIG. 2. Such signals are indicative of changes of resistance of the GMR element 300.

External magnetic fields parallel to the y axis tend not to change a resistance of the GMR element 300. However, magnetic fields in a direction parallel to the y axis can result in changes of sensitivity of the GMR 300 element dues to an effective change of amplitude of magnetic fields in the free layers perpendicular to the reference direction. Essentially, the magnetic fields parallel to the y axis either add to or oppose the magnetic fields of the free layers 316, 318.

Figure 4:
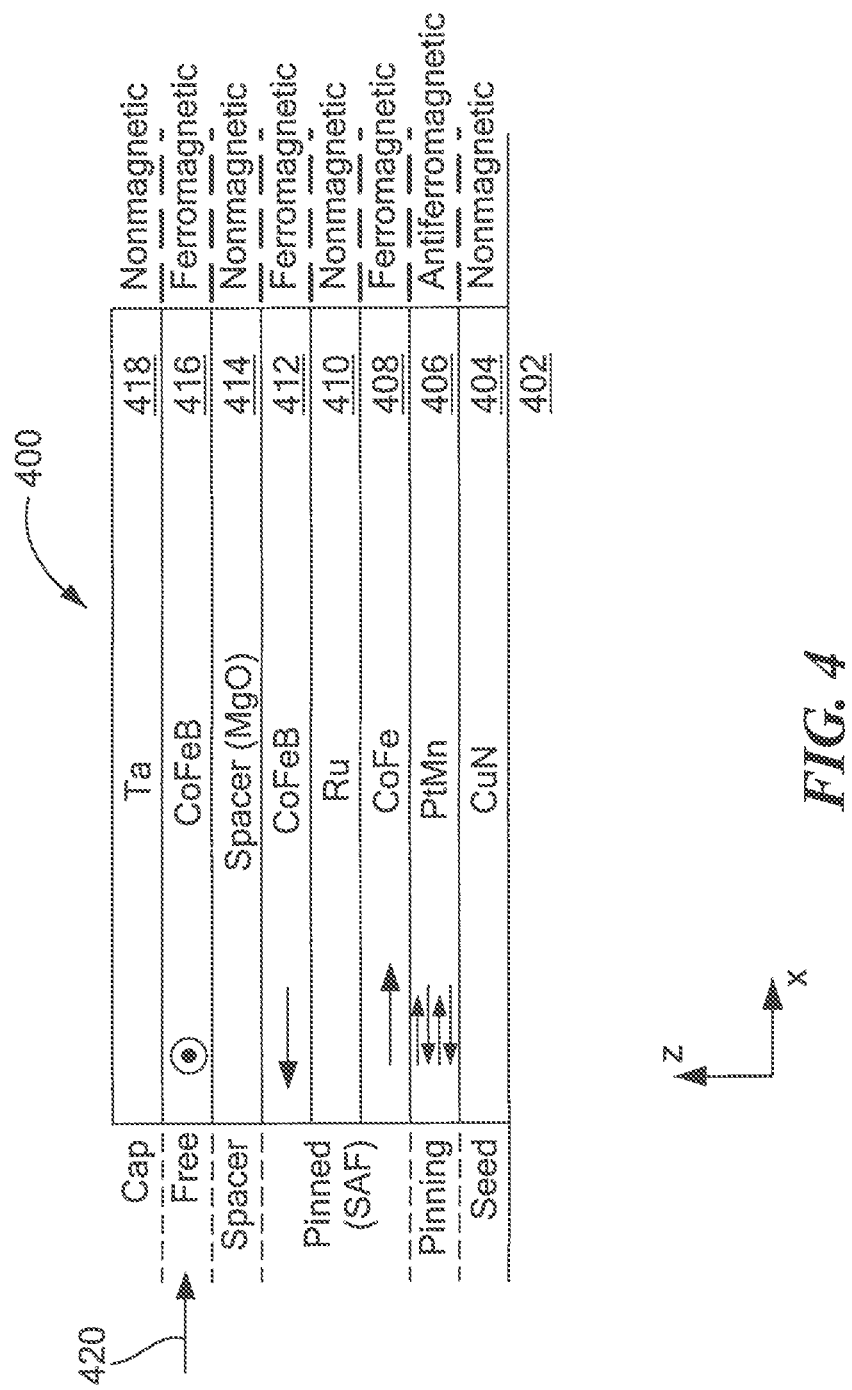
FIG. 4 is a block diagram showing a cross section of one pillar of an illustrative single pinned TMR element.

Referring now to FIG. 4, an illustrative TMR element pillar 400 can have a stack of layers 404-418 indicative of one pillar of a multi-pillar TMR element.

A driving current running through the TMR element pillar 400 can run through all of the layers of the stack, running between seed and cap layers 404 and 418, i.e., perpendicular to a surface of the substrate 402. The TMR element pillar 400 can have a maximum response axis that is parallel to the surface of the substrate and that is in the direction 420 perpendicular to zero field magnetic directions of a free layer 416, and also parallel to the field generated by reference layers, 406, 408, 410, 412.

The TMR element pillar 400 is single pinned, i.e., it has one pinning layer 406. A synthetic antiferromagnet (SAF) pinned layer structure 408, 410, 412 is magnetically coupled to the pinning layer 406. The layers 406, 408, 410, 412 are collectively referring to as reference layers. At zero external magnetic field, the free layer 416 takes on a magnetic alignment generally perpendicular to the reference layers 406, 408, 410, 412.

While single pinned TMR element pillars are described in examples herein, in other embodiments, double pinned arrangements are also possible with two pinning layers and two pinned layers on opposite sides of the free layers.

As described above, in general, the TMR element pillar 400 has a maximum response axis (maximum response to external fields) aligned with arrow 420, i.e., parallel with a reference direction of the reference layers 406, 408, 410, 412. Also, in general, it is rotations of the magnetic direction of the free layers 412, 414 caused by external magnetic fields that result in changes of resistance of the TMR stack 400.

The cross alignment of the free layers out of the page may not be facilitated by a shape anistropy of the TMR element 400. For example, if a top view of the TMR element 400 has a round shape, the free layers, in the absence of an external magnetic field, will tend to align in any direction. The maximum response axis 420 can still be parallel to the magnetic direction of the reference layers 406, 408, 410, 412. In the absence of a magnetic field, the magnetic direction of the free layer 416 can be in any direction. An external magnetic field, depending upon angle to the external magnetic field, tends to make the magnetic direction of the free layers change or rotate to align with the external magnetic field, resulting in changes of the resistance of the TMR element pillar 400.

The TMR element pillar 400 can directly sense magnetic fields that that have a projected component in the direction of the arrow 420, i.e., in an x direction parallel to an x axis of Cartesian coordinates x-y. Accordingly, external magnetic fields generated outside of a magnetic field sensor proximate to the TMR element pillar 400 and parallel to the x axis tend to be directly measured by the TMR element pillar 400, essentially by measuring offset shifts (i.e., resistance shifts) of AC signals generated by the magnetic fields 136, 138, 140, 142 of FIG. 1. Such signals are indicative of changes of resistance of the TMR element pillar 400.

External magnetic fields parallel to the x axis tend not to change a resistance of the TMR element pillar 400. However, magnetic fields in a direction parallel to the x axis can result in changes of sensitivity of the TMR element pillar 400 due to an effective change of amplitude of magnetic field in the free layer perpendicular to the reference direction. Essentially, the magnetic field parallel to the x axis either add to or oppose the magnetic field of the free layer 416.

Referring now to FIG. 5, a circuit portion 500 can include one or more TMR elements, here a single TMR element 506 having a plurality of TMR pillars, e.g., 102, 104, 106, 108 of FIG. 1, each pillar of which can be like the single pinned TMR element pillar of FIG. 4. The single TMR element 506 can be driven by a voltage source 502 to generate a current signal 504 that changes in response to a magnetic field. A current mirror circuit 508 can receive the current signal 504 and can generate a voltage signal 510 by a mirrored current passing through a resistor 512.

In other embodiments, the voltage generator 502 can be replaced by a current generator, the current mirror 508, the resistor 512 can be omitted, and current from the current generator can flow directly into the TMR element 506 to generate a voltage signal similar to the voltage signal 510. However, the circuit portion 500 is representative of simulations described in FIGS. 7-10.

A plurality of current conductors, here shown as coils 534, C1, C2, C3, C4, can be the same as or similar to the plurality of current conductors or coils 118, 120, 122, 124 of FIG. 1 and can be operable to generate one or more AC magnetic fields, e.g., four magnetic fields, indicated by an arrow 536, all in the same direction, and all parallel to the y axis. In some embodiments, only one, or one or more, current conductors or coils are used to generate magnetic fields parallel to the y axis.

A clock generator 528 can generate a clock signal 528a at a frequency fb. The clock signal 528a can be received by at one end of a resistor 530. A current signal 532 can result at the other end of the resistor 530. The current signal 532 can drive the plurality of current conductors or coils 534, C1, C2, C3, C4 to generate the AC magnetic fields 536 with the frequency of fb proximate to the plurality of pillars of the TMR element 506.

Another clock generator 540 can generate a clock signal 540a at a frequency fa. The clock signal 540a can be received by at one end of a resistor 542. A current signal 544 can result at the other end of the resistor 542. The current signal 542 can drive a coil 546, C5 to generate AC magnetic fields 548 with the frequency of fa proximate to the plurality of pillars of the TMR element 1506.

Directions of the AC magnetic fields 548 are parallel to the maximum response axis of the TMR element 506, i.e., parallel to an x axis. As described above in conjunction with FIG. 4, the TMR element 506 can have an AC change in resistance in response to the AC magnetic fields 548.

Directions of the AC magnetic fields 536 are perpendicular to the maximum response axis of the TMR element 506, i.e., parallel to an x axis. As described above in conjunction with FIG. 4, the TMR element 506 can have an AC change in sensitivity in response to the AC magnetic fields 536.

In operation, in response to an external field with a field bandwidth, current signal 504 (and voltage signal 510) can each be comprised of frequency bands around the frequency fa and frequency bands around the frequency fb, the frequency bands related to the field bandwidth. The current signal 504 (and voltage signal 510) can also be comprised of a lower frequency band of frequencies resulting from an external magnetic field sensed by the single magnetoresistance element 506, in particular, resulting from the in plane angle of the stray magnetic field when projected onto the x-y plane. The lower frequency band of frequencies can also be related to the field bandwidth.

The voltage signal 510 can be AC filtered by a capacitor 514 to generate a first AC coupled signal 514a. The voltage signal 510 can also be AC filtered by a capacitor 518 to generate a second AC coupled signal 518a.

A component determination module 524 can include two or more of a first demodulator 516, a second demodulator 520, or a low pass filter 522.

The first demodulator 516 can receive the AC coupled signal 514a and can receive the clock signal 540a. In operation, the demodulator 516 can multiply the AC coupled signal 514a with the clock signal 540a and low pass filter the result to generate a first demodulated signal 516a, also referred to herein as Dx. The demodulator 516 can include a square wave demodulator comprised of a switching circuit.

The second demodulator 520 can receive the AC coupled signal 518a and can receive the clock signal 528a. In operation, the demodulator 520 can multiply the AC coupled signal 518a with the clock signal 540a and low pass filter the result to generate a second demodulated signal 520a, also referred to herein as Dy. The demodulator 520 can include a square wave demodulator comprised of a switching circuit.

The low pass filter 522 can receive the AC voltage signal 510 and can generate a filtered signal 522a.

In some embodiments, it may be desirable that the frequencies fa and fb be substantially above a frequency of an external magnetic field that the single TMR element 506 senses.

The demodulators 516, 520 can essentially operate as amplitude detecting circuits, and the demodulated signals 516a, 520a are representative of amplitudes of the frequency bands surrounding the fa component and the fb component of AC coupled signals 514a, 518a, respectively. Thus, it will be appreciated that the demodulators 516, 520 can be replaced with other forms of amplitude detecting circuits, for example, rectifiers and filters.

In operation, an external magnetic field with a direction component parallel to the x axis, when projected onto the x-y plane, can amplitude modulate the signal components of the AC coupled signal 514a at the frequency fa, i.e., can generate AM (amplitude modulation) sidebands around the signal component at the frequency fa of the AC coupled signal 514a. The amplitude modulation is the result of the x component of the external magnetic field being parallel to the reference direction of the TMR element 506, which is parallel to the maximum response axis of the TMR element 506, essentially causing changes in the resistance (i.e., offset) of the TMR element 506. The demodulator 516 can be operable to detect an amplitude of the modulation of the frequency fa by the demodulated signal 516a. A relationship according to this operation is described below in conjunction with FIG. 7.

In operation, an external magnetic field with a direction component parallel to the y axis when projected onto the x-y plane can amplitude modulate the signal component at the frequency fa, i.e., can generate AM sidebands around the signal component at the frequency fa of the AC coupled signal 518a. The amplitude modulation is the result of they component of the external magnetic field being parallel to the free layer of the TMR element 506, essentially resulting in changes in sensitivity (i.e., amplitude, and not resistance) of the TMR element 506. The demodulator 520 can be operable to detect an amplitude of the modulation of the frequency fb by the demodulated signal 520a. A relationship according to this operation is described below in conjunction with FIG. 8.

In operation, an external magnetic field, when projected onto the x-y plane, can result in a low frequency part of the filtered signal 522a. A relationship according to this operation is described below in conjunction with FIG. 9.

Referring now to FIG. 6, in which like elements of FIG. 5 are shown having like reference designations, a magnetic field sensor 600 can be disposed upon a surface of a substrate 601, e.g., a semiconductor substrate. An x-y plane can be upon the surface 601. The magnetic field sensor 600 can include an amplitude/angle processor 602 coupled to receive at least one of the first demodulated signal 516a, the second demodulated signal 520a, or the filtered signal 522a.

The amplitude/angle processor 602 can be operable to generate a processed signal 602a indicative of at least one of an angle or an amplitude of an external magnetic field generated outside of the magnetic field sensor 600 and experienced by the TMR element 506.

A relationship memory 604 can be a non-volatile memory, e.g., an EEPROM, operable to store two or more of a first relationship, a second relationship, a third relationship, or a fourth relationship.

The first relationship can be similar to the relationship of FIG. 7 described below, the second relationship can be similar to the relationship of FIG. 8 described below, the third relationship can be similar to the relationship of FIG. 9 described below, and the fourth relationship can be similar to the relationship of FIG. 10 described below.

In operation, under control of a signal 602b generated by the amplitude/angle processor 602, relationship values 604a can be provided to the amplitude/angle processor 602.

The magnetic field sensor 600 can also include at least one of a Dx calibration memory 608, a Dy calibration memory 610, or an RLF calibration memory 612, each of which can be a non-volatile memory, for example, and EEPROM. The Dx calibration memory 608, the Dy calibration memory 610, and the RLF calibration memory 612 can provide respective calibration values 608a, 610a, 612a to the amplitude/angle processor 602.

In operation, the Dx, Dy, and RLF calibration values 608a, 610a, 612a can be used to adjust the DX, Dy, and RLF signals 516a, 520a, 522a according to a calibration technique. For example, the calibration technique can normalize a sensitivity and offset of the TMR element 506 to nominal values to result in normalized values related to signals 516a, 520a, 522a. The generation of and storage of the calibration values can be performed during manufacture of the magnetic field sensor 600 wherein the calibration values 608a, 610a, 612a can be provide in a calibration signal 614 for storage.

Operation of the amplitude/angle processor 602a is further described below in conjunction with FIGS. 11 and 12.

Referring now to FIG. 7, a graph 700 has a horizontal axis with a scale in units (in Oersteds) of x direction components parallel to an x axis of an external magnetic field projected onto an x-y plane of the surface of the substrate 601 of FIG. 6. The graph also has a vertical axis with a scale in units (in Oersteds) of y direction components parallel to any axis of an external magnetic field projected onto an x-y plane of the surface of the substrate 601 of FIG. 6. From discussion above, it will be understood that the TMR element 508 has a reference direction (and maximum response axis) parallel to the x axis.

Solid lines, e.g., line 702, are indicative of so-called "isolines" having the same amplitude of the demodulated signal 516a of FIGS. 5 and 6 for different values of the projected x and y components of the external magnetic field. While only a finite number of isolines are shown, there can be any number of isolines.

The isolines (e.g., 702) are shown having units of resistance (Rx), which is obtained by dividing the voltage values (Dx) of the demodulated signal 516a of FIGS. 5 and 6 by a current equal to a resistance of the resistor 512 of FIG. 5 by the voltage 504. In other embodiments, the voltage values are not divided by current and the isolines can have units of volts.

Referring now to FIG. 8, a graph 800 has a horizontal axis with a scale in units (in Oersteds) of x direction components parallel to an x axis of an external magnetic field projected onto an x-y plane of the surface of the substrate 601 of FIG. 6. The graph also has a vertical axis with a scale in units (in Oersteds) of y direction components parallel to any axis of an external magnetic field projected onto an x-y plane of the surface of the substrate 601 of FIG. 6. From discussion above, it will be understood that the TMR element 506 has a reference direction (and maximum response axis) parallel to the x axis.

Solid lines, e.g., line 802, are indicative isolines having the same amplitude of the demodulated signal 520a of FIGS. 5 and 6 for different values of the projected x and y components of the external magnetic field. While only a finite number of isolines are shown, there can be any number of isolines.

The isolines (e.g., 802) are shown having units of resistance (Ry), which is obtained by dividing the voltage values (Dy) of the demodulated signal 520a of FIGS. 5 and 6 a current equal to a resistance of the resistor 512 of FIG. 5 by the voltage 504. In other embodiments, the voltage values are not divided by current and the isolines can have units of volts.

Referring now to FIG. 9, a graph 900 has a horizontal axis with a scale in units (in Oersteds) of x direction components parallel to an x axis of an external magnetic field projected onto an x-y plane of the surface of the substrate 601 of FIG. 6. The graph also has a vertical axis with a scale in units (in Oersteds) of y direction components parallel to an y axis of an external magnetic field projected onto an x-y plane of the surface of the substrate 601 of FIG. 6. From discussion above, it will be understood that the TMR element 508 has a reference direction (and maximum response axis) parallel to the x axis Solid lines, e.g., line 902, are indicative isolines having the same amplitude of the filtered signal 522a of FIGS. 5 and 6 for different values of the projected x and y components of the external magnetic field. While only a finite number of isolines are shown, there can be any number of isolines.

The isolines (e.g., 902) are shown having units of resistance (RLF), which is obtained by dividing the voltage values (XXX) of the filtered signal 522a of FIGS. 5 and 6 by a current equal to a resistance of the resistor 512 of FIG. 5 by the voltage 504. In other embodiments, the voltage values are not divided by current and the isolines can have units of volts.

Referring now to FIG. 10, a graph 1000 has a horizontal axis with a scale in units (in degrees) of an external magnetic field projected on the x-y plane of the substrate 601 of FIG. 6. The graph 1000 also has a vertical axis with a scale in units of resistance of the TMR element pillar 506 of FIGS. 5 and 6. A zero angle is indicate of the external magnetic field parallel to the y axis and in a direction of the reference layer (i.e., layer 412 od FIG. 4) and a one hundred eighty degree angle is indicative of the external magnetic field parallel to the y axis but in the opposite direction, i.e., the direction 420 of FIG. 4.

A line 1002 indicative of a relationship between resistance of the TMR element 506 and the angle of the external magnetic field.

One or more of the relationships of FIG. 7, 8, 9, or 10 can be stored in the relationship memory 604 of FIG. 6. and can be used by the amplitude/angle processor 602 to determine an accurate amplitude and/or angle of an external magnetic field. This determination is made using one or more of the TMR element 506 of FIG. 6, each having a maximum response axis in the same direction, and each of which can be fabricated in the same way using the same annealing steps.

Referring now to FIGS. 11 and 12, processes 1100 and 1200 can be performed in the amplitude/angle processor 602 of FIG. 6.

It should be appreciated that FIGS. 11 and 12 show flowcharts corresponding to the below contemplated technique which would be implemented in angle-amplitude processor 602 (FIG. 6). Rectangular elements (typified by element 1102 in FIG. 11), herein denoted "processing blocks," represent computer software instructions or groups of instructions. Diamond shaped elements (typified by element 1120 in FIG. 11), herein denoted "decision blocks," represent computer software instructions, or groups of instructions, which affect the execution of the computer software instructions represented by the processing blocks.

Alternatively, the processing and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention. Thus, unless otherwise stated the blocks described below are unordered meaning that, when possible, the steps can be performed in any convenient or desirable order.

The processing and decision blocks are illustrative only, and some of the processing and decision blocks can be changed or omitted.

Referring to FIG. 11, an illustrative method 1100 begins at block 1102, at which one or more of four relationships are stored in the relationship memory 604 of FIG. 6. The four relationships can be in accordance with the first, second, third, and fourth relationships of FIGS. 7-10. At block 1102 calibration factors can also be stored in the calibration memories 608, 610, 612 of FIG. 6. As described above, in some embodiments, the calibration can result in normalized (corrected) values related to the signals 516a, 520a, 522a. In some embodiments, the process of block 1102 can be performed during manufacture of the magnetic field sensor 600 of FIG. 6.

At block 1104 in accordance with the demodulated signals 516a, 520a and filtered signal 522a, resistance values Rx, Ry, RLF are generated and calibrated. As described above, the demodulated signals 516a, 520a, and filtered signal 522a are voltage signals Dx, Dy, RLF, which can be converted to resistances Rx, Ry, RLF, respectively, by dividing the demodulated signals 516a, 520a and filtered signal 522a by a current equal to a resistance of the resistor 512 of FIG. 5 by the voltage 504. In other embodiments, the voltage values are not divided by current and the values can remain in units of volts.

At block 1106, the resistance signal RLF can be used in accordance with the stored relationship of FIG. 10, to identify a rough angle estimate, A, with a sign ambiguity.

At block 1108, the ambiguity in the estimate of block 1006 can be resolved using the calculated value of Ry to generate a resolved rough angle estimate, B. For example, a sign of the rough angle of the angle with ambiguity, A, estimated at block 1106 can be determined according to:

A>90 and Ry<0 then B=−A
A>90 and Ry>0 then B=A
A<90 and Ry>0 then B=−A
A<90 and Ry<0 then B=A At block 1110, from the measured value of the signal Dx, 516a of FIG. 6, an isoline for the calculated resistance value of Rx can be identified using the stored relationship of FIG. 7.

At block 1112, from the measured value of the signal Dy, 520a of FIG. 6, an isoline for the calculated resistance value of Ry can be identified using the stored relationship of FIG. 8.

At block 1114, from the measured value of the signal 522a of FIG. 6, an isoline for the calculated resistance value of RLF can be identified using the stored relationship of FIG. 9.

While calculated resistance values Rx and Ry are described above, in other embodiments, the values Dx and Dy of FIG. 6 can be used instead.

In accordance with blocks 1102, 1110. 1112, 1114, in some embodiments, referring, for example, to FIGS. 7-9, Rx, Ry, and RLF isolines (relationships) are measured or calculated (e.g., using signals Dx, Dy, RLF of FIG. 6) and then stored in advance, e.g., during production. In operation, the stored isolines may or may not be interpolated to find interpolated isolines. Regardless, isolines can be used in accordance with the measured values of the signals Dx, Dy, RLF of FIG. 6 to find isoline intersections described below.

In other embodiments, referring again, for example, to FIGS. 7-9, all (or many) Rx, Ry, and RLF values without consideration of isolines, can be measured or calculated and then stored in advance, e.g., during production. Isolines (relationships) may then be determined from this stored data, either on the fly during measuring or all at once before measuring, with or without interpolation.

At block 1116, one or more first fine angle estimates, Cn, of the angle of the external magnetic field projected onto the x-y plane of the substrate 601 of FIG. 6 can be found using a respective one or more intersections of isolines of the first and second stored relationships of FIGS. 7 and 8, the isolines determined in accordance with the measured values of the signals 516a, 520a of FIG. 6 converted to the resistance values of Rx and Ry.

Here and in some steps below, intersections are used to provide angle estimates. Rx, Ry, and RLF (or equivalently, Dx, Dy, RLF) are encodings in Hx, Hy magnetic field space. Intersections of isolines provides a computation of the external magnetic field in the Hx, Hy magnetic space.

At block 1118, one or more second fine angle estimates, Dn, of the angle of the external magnetic field projected onto the x-y plane of the substrate 601 of FIG. 6 can be found using a respective one or more intersections of isolines of the second and third stored relationships of FIGS. 8 and 9, the isolines determined in accordance with the measured values of the signals 520a, 522a of FIG. 6 converted to the resistance values of Ry and RLF.

At block 1120 it is determined if there is any intersection of isolines determined at blocks 1116 or 1118.

If there is an intersection, the process 1100 continues to A of FIG. 12. If there is no intersection, the process 1100 continues to B of FIG. 12. However, in other embodiments, the process 1100 can end, in which case, either the resolved rough angle estimate, B, of block 1108, the first fine angle estimate determined at block 1116, or the second fine angle estimate determined at block 1118 can be used as the final angle estimate. In other embodiments, a combination of the three angles can be used, for example, and average of the three angles.

Referring now to FIG. 12, beginning at A of FIGS. 11 and 12, at block 1202, if there is only one intersection of isolines identified at block 1116, and a corresponding one value, Cn, of the first fine angle estimate, then the process 1200 proceeds to block 1212, where the one values of Cn is selected as a final angle estimate.

At block 1202, if it is not true that there is only one intersection of isolines identified at block 1116, and a corresponding one value, Cn, of the first fine angle, then the process proceeds to block 1204.

At block 1204, if no first angle estimate, Cn, is found, and if there is only one intersection of isolines identified at block 1118, and a corresponding one value, Dn, of the second fine angle estimate, then the process 1200 proceeds to block 1214, where the one value of Dn is selected as the final angle estimate.

At block 1204, if it is not true that there is no first angle estimate, Cn, and if there is only one intersection of isolines identified at block 1118, and a corresponding one value, Dn, of the second fine angle, then the process proceeds to block 1206.

At block 1206, if more than one first angle estimate, Cn, is found, and there is no intersection of isolines identified at block 1118, and a corresponding no value, Dn, of the second fine angle estimate, then the process 1200 proceeds to block 1216, where the one value of Cn closest to the value of the resolved rough angle estimate of block 1108 is selected as the final angle estimate.

If, at block 1206, if it is not true that more than one first angle estimate, Cn, is found, and there is no intersection of isolines identified at block 1118, and a corresponding no value, Dn, of the second fine angle estimate, then the process proceeds to block 1208.

At block 1208, if more than one second angle estimate, Dn, is found, and if there is no intersection of isolines identified at block 1116, and a corresponding no value, Cn, of the first fine angle estimate, then the process 1200 proceeds to block 1218, where the one value of Dn closest to the value of the resolved rough angle estimate of block 1108 is selected as the final angle estimate.

If, at block 1208, if it is not true that more than one second angle estimate, Dn, is found, and there is no intersection of isolines identified at block 1116, and a corresponding no value, Cn, of the first fine angle estimate, then the process proceeds to block 1210.

At block 1210, angle distances between values of the first fine angle estimates, Cn, and the second fine angle estimates, Dn, are calculated.

At block 1220, a final angle estimate is determined in accordance with a first fine angle estimate, Cn, having a smallest angle distance determined at block 1210.

From B of FIGS. 11 and 12, the resolve rough angle estimate determined at block 1108 of FIG. 11 is selected as the final angle estimate.

Blocks 1212, 1214, 1216, 1218, 1220, 1222 result in one final angle estimate send to block 1224. Essentially, and uppermost one of the blocks 1212, 1214, 1216, 1218, 1220, 1222 having a final angle value is selected as the one final angle value.

At block 1224 an amplitude of the external magnetic field projected onto the x-y plane of the substrate 601 of FIG. 6 can be calculated. In order to obtain amplitude, it should be understood that the intersections (Cns and Dns) identified at blocks 1116 and 1118 can each be associated with x and y external magnetic fields, i.e., Hx and Hy. From the identified orthogonal external magnetic fields, vector amplitudes can be calculated as square root of the sum of squares of the measured values for each intersection. If at block 1224, one Cn or one Dn remains, then there is one sum of the squares and one calculated amplitude.

At block 1226 it can be determined if the amplitude calculated at block 1226 is too high or two low according to a high threshold level and a low threshold level. If that amplitude is too high or too low, then at block 1228 a flag can be set in the magnetic field sensor 600 of FIG. 6 and the process 1200 can return to block 1104 of FIG. 11. If that amplitude is not too high or too low, then at block 1230 the flag can be cleared in the magnetic field sensor 600 of FIG. 6 and the process 1200 can return to block 1104 of FIG. 11.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetic field sensor, comprising:
   a substrate having a major surface in an x-y plane having an x axis and a y axis;
   one or more magnetoresistance elements disposed on the substrate, wherein magnetic directions of reference layers of each of the one or more magnetoresistance elements are parallel to the x axis; wherein the one or more magnetoresistance elements are operable to generate a magnetoresistance element signal responsive to an external magnetic field;
   a first current conductor disposed on the substrate and operable to generate a first AC magnetic field in an x-direction parallel to the x axis, the first AC magnetic field proximate to the one or more magnetoresistance elements, the first AC magnetic field having a first frequency;
   a second current conductor operable to generate a second AC magnetic field in a y-direction parallel to the y axis, the second AC magnetic field proximate to the one or more magnetoresistance elements, the second AC magnetic field having the first frequency or a second frequency different than the first frequency; and
   a component determination circuit disposed on the substrate and coupled to receive the magnetoresistance element signal, wherein the component determination circuit comprises at least two of:
   a first demodulator coupled to the magnetoresistance element signal and coupled to receive a first clock signal with the first frequency, the first demodulator operable to demodulate the magnetoresistance element signal with the first clock signal to generate a first demodulated signal,
   a second demodulator coupled to the magnetoresistance element signal and coupled to receive the first clock signal with the first frequency or a second clock signal with the second frequency, the second demodulator operable to demodulate the magnetoresistance element signal with the first clock signal or with the second clock signal to generate a second demodulated signal, or
   a low pass filter operable to filter the magnetoresistance element signal to generate a filtered signal.

2. The magnetic field sensor of claim 1, further comprising:
   an amplitude/angle processor operable to use at least two of the first demodulated signal, the second demodulated signal, or the filtered signal to generate an amplitude/angle signal indicative of an angle of the external magnetic field projected onto the x-y plane.

3. The magnetic field sensor of claim 1, wherein the second demodulator is coupled to receive the second clock signal with the second frequency, wherein the first and second demodulators operate at the same time.

4. The magnetic field sensor of claim 1, wherein the first and second demodulators are time multiplexed.

5. The magnetic field sensor of claim 1, further comprising:
   a non-volatile memory for storing a relationship between a plurality of values of the filtered signal and a plurality of angles of the external magnetic field projected onto the x-y plane.

6. The magnetic field sensor of claim 5, further comprising:
   an amplitude/angle processor operable to use at least two of the first demodulated signal, the second demodulated signal, or the filtered signal to generate an amplitude/angle signal indicative of an angle of the external magnetic field projected onto the x-y plane, wherein the amplitude/angle processor is operable to generate a rough angle estimate, with half plane ambiguity, of the external magnetic field projected onto the x-y plane, by using the filtered signal and the relationship, wherein the amplitude/angle processor is operable use the second demodulated signal to resolve the ambiguity to identify a resolved rough angle estimate of the external magnetic field projected onto the x-y plane.

7. The magnetic field sensor of claim 1, further comprising:
   a non-volatile memory for storing at least two of a first relationship between values of the first demodulated signal versus x and y magnetic fields in the x-y plane, a second relationship between values of the second demodulated signal versus the x and y magnetic fields in the x-y plane, or a third relationship between values of the filtered signal versus the x and y magnetic fields in the x-y plane.

8. The magnetic field sensor of claim 7, further comprising:
   an amplitude/angle processor operable to use at least two of the first demodulated signal, the second demodulated signal, or the filtered signal to generate an amplitude/angle signal indicative of an angle of the external magnetic field projected onto the x-y plane, wherein the amplitude/angle processor is operable to generate a fine angle estimate based on the second demodulated signal, at least one of first demodulated signal or the filtered signal, the second relationship, and at least one of the first relationship or the third relationship.

9. A method used in a magnetic field sensor responsive to an external magnetic field generated outside of the magnetic field sensor, comprising:

generating a magnetoresistance element signal responsive to the external magnetic field with one or more magnetoresistance elements disposed on a substrate, the substrate having a major surface in an x-y plane having an x axis and a y axis wherein magnetic directions of reference layers of each of the one or more magnetoresistance elements are parallel to the x-axis;

generating a first AC magnetic field in an x-direction parallel to the x axis with a first current conductor disposed on the substrate, the first AC magnetic field proximate to the one or more magnetoresistance elements, the first AC magnetic field having a first frequency;

generating a second AC magnetic field in a y-direction parallel to the y axis with a second current conductor, the second AC magnetic field proximate to the one or more magnetoresistance elements, the second AC magnetic field having the first frequency or a second frequency different than the first frequency; and at least two of:

demodulating, with a first demodulator, the magnetoresistance element signal with a first clock signal to generate a first demodulated signal, demodulating, with a second demodulator, the magnetoresistance element signal with the first clock signal or with a second clock signal to generate a second demodulated signal, or filtering the magnetoresistance element signal with a low pass filter to generate a filtered signal.

10. The method of claim 9, further comprising:
using at least two of the first demodulated signal, the second demodulated signal, or the filtered signal to generate an amplitude/angle signal indicative of an angle of the external magnetic field projected onto the x-y plane.

11. The method of claim 9, wherein the demodulating, with the second demodulator, comprises:
demodulating, with the second demodulator, the magnetoresistance element signal with the second clock signal to generate the second demodulated signal, wherein the first and second demodulators operate at the same time.

12. The method of claim 9, wherein the first and second demodulators are time multiplexed.

13. The method of claim 9, further comprising:
storing, in a non-volatile memory, a relationship between a plurality of values of the filtered signal and a plurality of angles of the external magnetic field projected onto the x-y plane.

14. The method of claim 13, further comprising:
generating a rough angle estimate, with half plane ambiguity, of the external magnetic field projected onto the x-y plane, by using the filtered signal and the relationship; and
using the second demodulated signal to resolve the ambiguity to identify a resolved rough angle estimate of the external magnetic field projected onto the x-y plane.

15. The method of claim 9, further comprising:
storing, in a non-volatile memory, at least two of a first relationship between values of the first demodulated signal versus x and y magnetic fields in the x-y plane, a second relationship between values of the second demodulated signal versus the x and y magnetic fields in the x-y plane, or a third relationship between values of the filtered signal versus the x and y magnetic fields in the x-y plane.

16. The method of claim 15, further comprising:
generating a fine angle estimate based on the second demodulated signal, at least one of first demodulated signal or the filtered signal, the second relationship, and at least one of the first relationship or the third relationship.

17. The method of claim 16, wherein the generating the fine angle estimate comprises:
identifying a first isoline using a value of the first demodulated signal and using the first relationship;
identifying a second isoline using a value of the second demodulated signal and using the second relationship;
identifying an intersection of the first and second isolines to generate a first set of fine angles of the external magnetic field projected onto the x-y plane.

18. The method of claim 17, wherein the using further comprises:
identifying a third isoline using a value of the filtered signal and using the third relationship;
identifying an intersection of the second and third isolines to generate a second set of fine angles of the external magnetic field projected onto the x-y plane.

19. The method of claim 18, wherein the using further comprises:
selecting an angle from the first set of fine angles or the second set of fine angles, wherein the selected angle is identified as the angle of the external magnetic field projected onto the x-y plane.

20. The method of claim 19, wherein the using further comprises:
calculating the amplitude of the external magnetic field projected onto the x-y plane in accordance with the selected angle.

21. A magnetic field sensor responsive to an external magnetic field generated outside of the magnetic field sensor, comprising:
means for generating a magnetoresistance element signal responsive to the external magnetic field with one or more magnetoresistance elements disposed on a substrate, the substrate having a major surface in an x-y plane having an x axis and a y axis, wherein magnetic directions of reference layers of each of the one or more magnetoresistance elements are parallel to the x-axis;
means for generating a first AC magnetic field in an x-direction parallel to the x axis with a first current conductor disposed on the substrate, the first AC magnetic field proximate to the one or more magnetoresistance elements, the first AC magnetic field having a first frequency;
means for generating a second AC magnetic field in a y-direction parallel to the y axis with a second current conductor, the second AC magnetic field proximate to the one or more magnetoresistance elements, the second AC magnetic field having the first frequency or a second frequency different than the first frequency; and at least two of:
means for demodulating, with a first demodulator, the magnetoresistance element signal with a first clock signal to generate a first demodulated signal,
means for demodulating, with a second demodulator, the magnetoresistance element signal with the first clock signal or with a second clock signal to generate a second demodulated signal, or
means for filtering the magnetoresistance element signal with a low pass filter to generate a filtered signal.

22. The magnetic field sensor of claim 21, further comprising:
  means for using at least two of the first demodulated signal, the second demodulated signal, or the filtered signal to generate an amplitude/angle signal indicative of an angle of the external magnetic field projected onto the x-y plane.

23. The magnetic field sensor of claim 21, wherein the means for demodulating, with the second demodulator, comprises:
  means for demodulating, with the second demodulator, the magnetoresistance element signal with the second clock signal to generate the second demodulated signal, wherein the first and second demodulators operate at the same time.

24. The magnetic field sensor of claim 21, wherein the first and second demodulators are time multiplexed.

25. The magnetic field sensor of claim 21, further comprising:
  means for storing, in a non-volatile memory, a relationship between a plurality of values of the filtered signal and a plurality of angles of the external magnetic field projected onto the x-y plane.

26. The magnetic field sensor of claim 25, further comprising:
  means for generating a rough angle estimate, with half plane ambiguity, of the external magnetic field projected onto the x-y plane, by using the filtered signal and the relationship; and
  means for using the second demodulated signal to resolve the ambiguity to identify a resolved rough angle estimate of the external magnetic field projected onto the x-y plane.

27. The magnetic field sensor of claim 21, further comprising:
  means for storing, in a non-volatile memory, at least two of a first relationship between values of the first demodulated signal versus x and y magnetic fields in the x-y plane, a second relationship between values of the second demodulated signal versus the x and y magnetic fields in the x-y plane, or a third relationship between values of the filtered signal versus the x and y magnetic fields in the x-y plane.

28. The magnetic field sensor of claim 27, further comprising:
  means for generating a fine angle estimate based on the second demodulated signal, at least one of first demodulated signal or the filtered signal, the second relationship, and at least one of the first relationship or the third relationship.

29. The magnetic field sensor of claim 28, wherein the generating the fine angle estimate comprises:
  means for identifying a first isoline using a value of the first demodulated signal and using the first relationship;
  means for identifying a second isoline using a value of the second demodulated signal and using the second relationship; and
  means for identifying an intersection of the first and second isolines to generate a first set of fine angles of the external magnetic field projected onto the x-y plane.

30. The magnetic field sensor of claim 29, wherein the using further comprises:
  means for identifying a third isoline using a value of the filtered signal and using the third relationship;
  means for identifying an intersection of the second and third isolines to generate a second set of fine angles of the external magnetic field projected onto the x-y plane.

31. The magnetic field sensor of claim 30, wherein the using further comprises: means for selecting an angle from the first set of fine angles or the second set of fine angles, wherein the selected angle is identified as the angle of the external magnetic field projected onto the x-y plane.

32. The magnetic field sensor of claim 31, wherein the using further comprises:
  means for calculating an amplitude of the external magnetic field projected onto the x-y plane in accordance with the selected angle.

* * * * *

UNITED STATES PATENT AND TRADEMARK OFFICE
CERTIFICATE OF CORRECTION

PATENT NO. : 10,670,669 B2
APPLICATION NO. : 16/157313
DATED : June 2, 2020
INVENTOR(S) : Rémy Lassalle-Balier et al.

Page 1 of 1

It is certified that error appears in the above-identified patent and that said Letters Patent is hereby corrected as shown below:

In the Specification

Column 8, Line 13 delete "referring" and replace with --referred--.

Column 10, Line 31 delete "by at one" and replace with --at one--.

Column 11, Line 47 delete "they" and replace with --the--.

Column 12, Line 36 delete "provide" and replace with --provided--.

Column 13, Line 26 delete "an" and replace with --a--.

Column 13, Line 50 delete "indicate" and replace with --indicative--.

Column 13, Line 56 delete "indicative" and replace with --is indicative--.

Signed and Sealed this
Twenty-fourth Day of November, 2020

Andrei Iancu
*Director of the United States Patent and Trademark Office*